United States Patent
Mas et al.

(10) Patent No.: US 7,567,074 B2
(45) Date of Patent: Jul. 28, 2009

(54) MEASURING DEVICE FOR MEASURING DIFFERENTIAL CURRENT, TRIP MODULE COMPRISING ONE SUCH MEASURING DEVICE AND SWITCHGEAR UNIT HAVING ONE SUCH MODULE

(75) Inventors: Patrick Mas, Saint Martin D'Uriage (FR); Sebastien Buffat, Seyssins (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 154 days.

(21) Appl. No.: 11/473,241

(22) Filed: Jun. 23, 2006

(65) Prior Publication Data

US 2006/0290454 A1    Dec. 28, 2006

(30) Foreign Application Priority Data

Jun. 24, 2005    (FR)    ................................. 05 06438

(51) Int. Cl.
*G01R 15/20* (2006.01)
(52) U.S. Cl. .................................................. 324/117 R
(58) Field of Classification Search ........................ None
See application file for complete search history.

(56) References Cited

U.S. PATENT DOCUMENTS 4,459,575 A * 7/1984 Geissler et al. ............. 336/196
4,887,029 A * 12/1989 Hemminger ................ 324/142
5,828,282 A * 10/1998 Tiemann .................... 336/174
6,246,311 B1 * 6/2001 Finnemore et al. .......... 336/192

FOREIGN PATENT DOCUMENTS

EP    0959484    11/1999
EP    1475874    11/2004

* cited by examiner

*Primary Examiner*—Jermele M Hollington
(74) *Attorney, Agent, or Firm*—Steptoe & Johnson LLP

(57) ABSTRACT

A device for measuring differential current designed to measure differential current in at least two current lines, comprising a first magnetic circuit designed to surround the current lines, forming a primary circuit of a transformer, a first secondary winding wound around said magnetic circuit and forming the secondary circuit of the transformer, a metal shielding surrounding the first secondary winding and the magnetic circuit. The device for measuring differential current in addition comprises at least one second secondary winding surrounding at least a part of the metal shielding. This second winding forms a second magnetic circuit of at least one second current sensor designed to supply an electric signal representative of a current flowing in at least one current line.

14 Claims, 5 Drawing Sheets

MEASURING DEVICE FOR MEASURING DIFFERENTIAL CURRENT, TRIP MODULE COMPRISING ONE SUCH MEASURING DEVICE AND SWITCHGEAR UNIT HAVING ONE SUCH MODULE

BACKGROUND OF THE INVENTION

The invention relates to a device for measuring differential current in at least two current lines. Said device comprises a first magnetic circuit designed to surround the current lines, forming a primary circuit of a transformer and comprises a first secondary winding wound around said magnetic circuit and forming the secondary circuit of the transformer. A metal shielding surrounds the first secondary winding and the magnetic circuit.

STATE OF THE ART

To detect the presence of differential currents flowing in electric current lines or electric conductors 25, it is extremely common practice to use differential sensors comprising a first secondary winding 11 wound around a magnetic core 16. As represented in FIGS. 1 and 2, said core, in particular circular or rectangular in shape, surrounds the electric current lines or the electric conductors 25. The electric current lines or the electric conductors will henceforth be called current lines.

The first secondary winding 11 wound on the core 16 forms a secondary winding of a transformer where the current lines 25 form the primary circuit. Said secondary winding supplies a measurement signal. The voltage supplied at the terminals of the secondary winding is in fact directly proportional to the intensity of the sum of the electric currents flowing in the current lines 25. The first secondary winding 11 of the differential sensor is designed to be connected to processing means 29 of a switchgear device 50. These processing means 29 analyze the signal received and can in particular command opening of contacts 30 placed on the electric current lines 25. Opening of the contacts 30 is performed by an operating mechanism 32 via a relay 31.

On account of the great sensitivity of this type of differential sensor 9 designed to measure weak electric currents, the first secondary winding 11 is generally placed inside a shielding 10.

The shielding 10 of the differential sensor reduces the influence of the external disturbances which might in certain cases give rise to differential current measurement errors and cause spurious tripping in the event of a load surge.

As described in the documents EP0959484 and WO9119305, the use of a shielding 10 placed around a differential sensor is extremely widespread. The shielding 10 can be made up of several parts, in particular an outer shielding, an inner shielding and at least one lateral shielding.

Measurement of the differential current is generally performed concomitantly with measurement of the electric currents respectively flowing in the current lines 25. The electric currents respectively flowing in the current lines 25 are henceforth called the main currents.

A differential sensor 9 designed to measure low-intensity currents can not provide information relating to the main currents. A differential sensor is in fact rapidly saturated by the presence of high-intensity electric currents, in particular short-circuit currents.

Measurement of electric currents is generally performed by current sensors 22 placed independently on the current lines 25. As represented in FIG. 1, the current sensors 22 are connected in traditional manner to the processing means 29 of a switchgear device 50. As the purpose of said sensors is to measure the electric currents flowing in the current lines 25, the information sent to the processing means 29 in particular enables the current line on which said sensor is positioned to be protected.

These current sensors 22 can also be connected to power supply means 28 to supply electric power to the processing means 29. Thus, due to the presence of the current sensors 22, electric power supply of the processing means 29 associated with the differential sensor 9 is performed without any auxiliary electric power supply.

The positioning of the set of current sensors 22, 9 in a switchgear device 50 may become critical when the space available inside said switchgear device is limited. As is represented in FIG. 1, this particularly proves to be the case when the switchgear device 50 is a four-pole or three-pole unit and each of the current lines 25 comprises a current sensor 22 and when a differential sensor 9 surrounds the current lines 25.

Certain solutions in particular described in the document EP1045500 make do with using two current sensors only instead of three. The missing information from the third current line can be reconstituted by means of electronic processing from the information from two current sensors. In the latter architecture, protection is however not performed if a single-phase short-circuit occurs on the current line that is not provided with a current sensor. The differential sensor generally designed to measure weak current of a few tens of milliamps is then saturated due to the presence of short-circuit current and can not provide any information.

SUMMARY OF THE INVENTION

The object of the invention is therefore to remedy the shortcomings of the state of the art so as to propose a device for measuring differential electric current having a wide measurement range enabling both weak differential currents and strong short-circuit currents to be measured.

The measuring device according to the invention comprises at least one second secondary winding surrounding at least a part of the metal shielding and forming a second magnetic circuit of at least one second current sensor designed to supply an electric signal representative of a current flowing in at least one current line.

Preferably, the metal shielding is made up of an outer shielding, an inner shielding and at least one lateral shielding.

Advantageously, the metal shielding comprises two lateral shieldings.

In a particular embodiment, at least one second secondary winding surrounds at least a part of the outer shielding, at least a part of the inner shielding and at least a part of the lateral shieldings. Said shieldings surrounded by said at least one second secondary winding form the magnetic circuit of at least one second current sensor, each shielding surrounding the current lines.

Advantageously, a second secondary winding completely surrounds the metal shielding.

Advantageously, at least one second secondary winding surrounds at least a part of one of the lateral shieldings.

Advantageously, at least one second secondary winding surrounds one of the two lateral shieldings.

According to a development of the invention, at least one second secondary winding surrounds at least a part of a first lateral shielding, and at least one second secondary winding surrounds at least a part of the second lateral shielding. Said surrounded shieldings form the magnetic circuits of at least two second current sensors.

In a particular embodiment, at least one of the shieldings surrounded by a second secondary winding comprises at least one air-gap.

A trip module designed to be connected to a switchgear device and comprising N current lines comprises a measuring device for measuring differential current as defined above. The measuring device is placed around current lines. The second current sensor of the device for measuring differential current is designed to be connected to power supply means and/or processing means of a switchgear device, the first secondary winding of the device for measuring differential current being designed to be connected to processing means of said switchgear device.

Advantageously, at least N−1 current lines respectively have a mixed current sensor comprising a first winding wound on a magnetic circuit and designed to be connected to the power supply means of a switchgear device. The mixed current sensor also comprises a second winding wound on a non-magnetic circuit and designed to be connected to the processing means of a switchgear device.

A switchgear device designed for protection of at least N current lines comprises power supply means, processing means, an electric contact opening mechanism and comprises a trip module as defined above. The processing means of the switchgear device are connected to the device for measuring differential current of said trip module.

Advantageously, the power supply means are connected to the mixed current sensors of the trip module via the windings and are connected to at least one second secondary winding of the device for measuring differential current.

Advantageously, the processing means are connected to the mixed current sensors of the trip module via the windings and are connected to the first secondary winding of the device for measuring differential current.

BRIEF DESCRIPTION OF THE FIGURES

Other advantages and features will become more clearly apparent from the following description of a particular embodiment of the invention, given as a non-restrictive example only and represented in the accompanying drawings in which.

DETAILED DESCRIPTION OF AN EMBODIMENT

Figure 1:
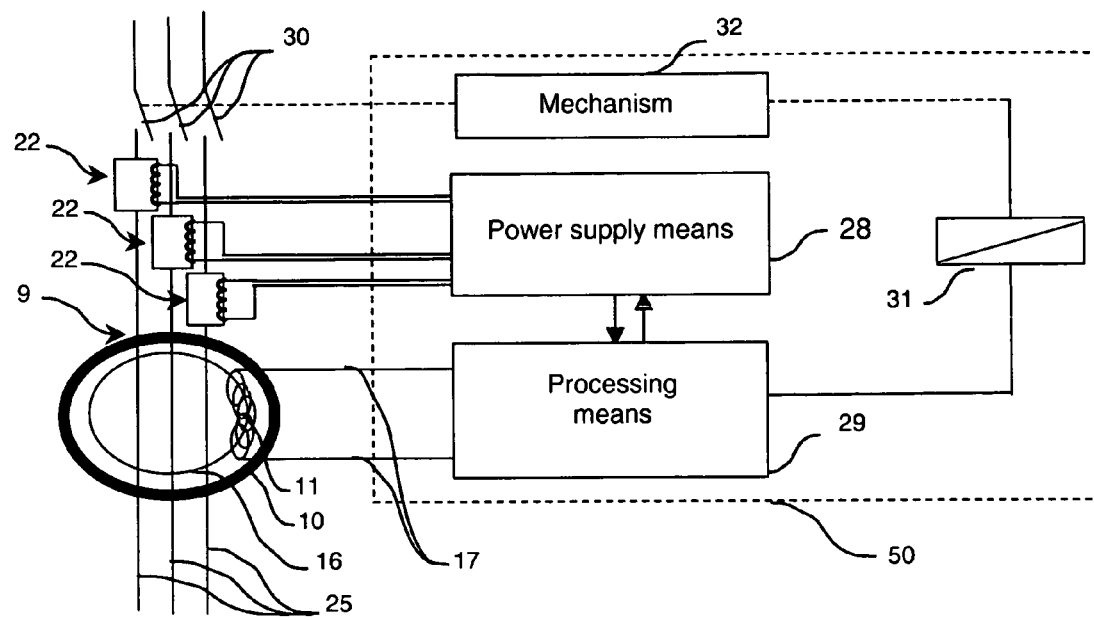
FIG. 1 represents a block diagram of a switchgear device of known type integrating current sensors and a differential sensor.
Figure 2:
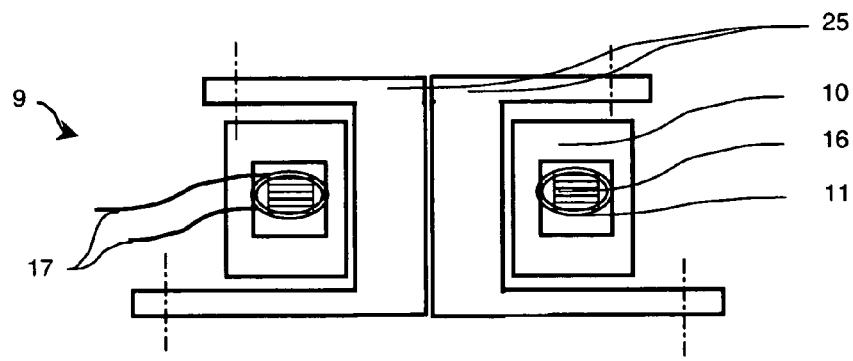
FIG. 2 represents a schematic cross-sectional view of a shielded differential sensor of known type.
Figure 3:
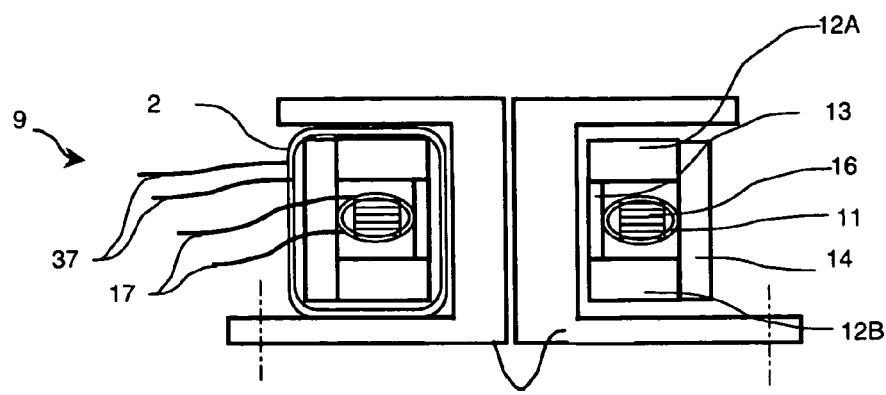
FIGS. 3 and 4 represent a device for measuring differential current according to one embodiment of the invention.
Figure 4:
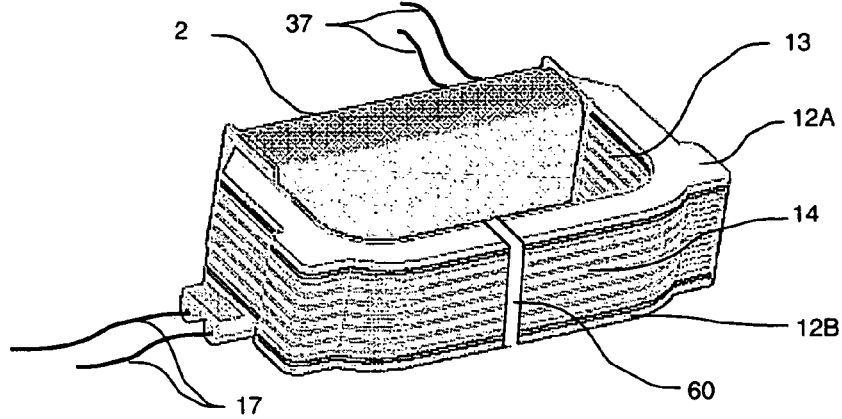

According to the preferred embodiment of the invention represented in FIGS. 3 and 4, the device for measuring differential current 9 comprises a magnetic core 16 having a substantially closed rectangular outline. Said core is made of highly permeable magnetic material from a crystalline or nanocrystalline alloy. The magnetic core 16 has a rectangular cross-section and can be made from a wound strip or from stacked plates. In order to optimize the sensitivity of the device for measuring differential current 9, the core 16 does not have an air-gap. Said core is designed to be fitted surrounding current lines 25.

The magnetic core 16 is surrounded by a first secondary winding 11 designed to measure a differential current able to flow in the current lines 25. The first secondary winding 11 is arranged over the whole perimeter of the magnetic core 16.

This first secondary winding 11 thus forms the secondary winding of a current transformer. The primary circuit is formed by current lines 25. The first secondary winding 11 is designed to be connected to the processing means of a switchgear device 50 via connecting wires 17.

A metal shielding 10 is used to limit the influence of external disturbances on differential current measurement. This shielding 10 is formed by an outer shielding 14, an inner shielding 13 and at least one lateral shielding 12. In the embodiment described, to limit the influence of external disturbances as best as possible, two lateral shieldings 12A, 12B are used. Preferably, each part 12, 13 and 14 of the shielding 10 surrounds the current lines 25. Each part 12, 13 and 14 of the shielding 10 can be achieved in the form of a wound strip or stacked plates.

The shieldings are made from magnetic material with a high saturation induction and preferably a high permeability. The choice of a high saturation induction material means that the shielding does not saturate in the presence of strong main currents.

At least one second secondary winding 2 surrounds a part of the shielding 10. According to one embodiment of the invention represented in FIGS. 3 and 4, a second secondary winding 2 surrounds at least a part of the outer shielding 14, at least a part of the inner shielding 13 and at least a part of the lateral shieldings 12A, 12B. Each of the shieldings 13, 14, 12A, 12B surrounds the current lines 25.

Said shieldings surrounded by the second secondary winding 2 form the magnetic circuit of a second current sensor. The second current sensor is designed to be connected to the processing means 29 of a switchgear device 50 via connecting wires 37.

Depending on the type of application involved, this second current sensor can be connected to the processing means 29 and/or to the power supply means 28 of said switchgear device.

This second sensor can be designed to perform measurement of high-intensity differential current to extend the measuring range of the differential sensor. According to the described embodiment, the material used to produce the shielding is an iron (Fe) and silicon (Si) alloy. This alloy (FeSi) does not present a sufficient permeability to measure weak differential currents. Therefore, when the shielding does not comprise an air-gap, medium and strong differential currents, i.e. currents of 300 mA and more, can in fact be measured.

In addition, this sensor can also perform measurements of high-intensity main currents, in particular on a current line not provided with a mixed current sensor 22. It is then indispensable to create an air-gap 60 on at least a part of the shielding 10 so that the latter is not saturated when the current flows.

Figure 5:
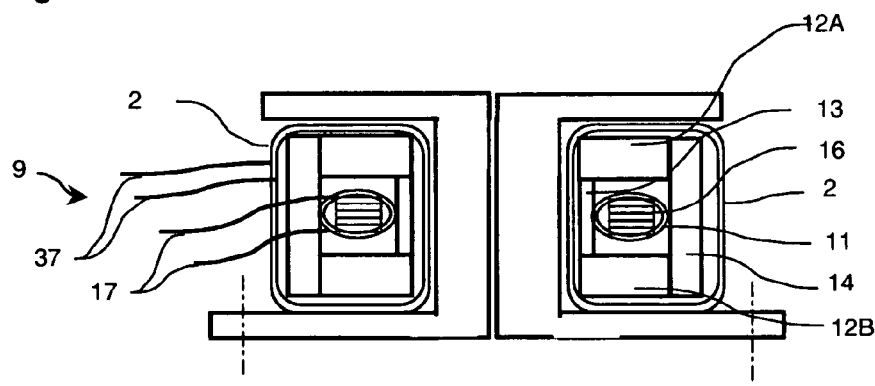
FIGS. 5 to 10 represent alternative embodiments of the device for measuring differential current according to FIGS. 3 and 4.

According to a second embodiment of the invention as represented in FIG. 5, at least one second secondary winding 2 completely surrounds the metal shielding 10.

Figure 6:
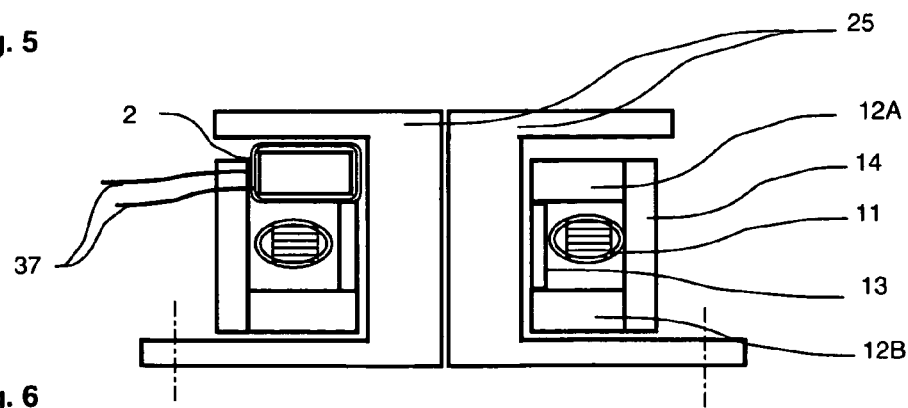

According to an alternative embodiment of the invention represented in FIG. 6, at least one second secondary winding 2 can surround at least a part of one of the two lateral shieldings 12A or 12B. The part of the shielding 10 surrounded by the secondary winding 2 surrounds the current lines 25.

Figure 7:
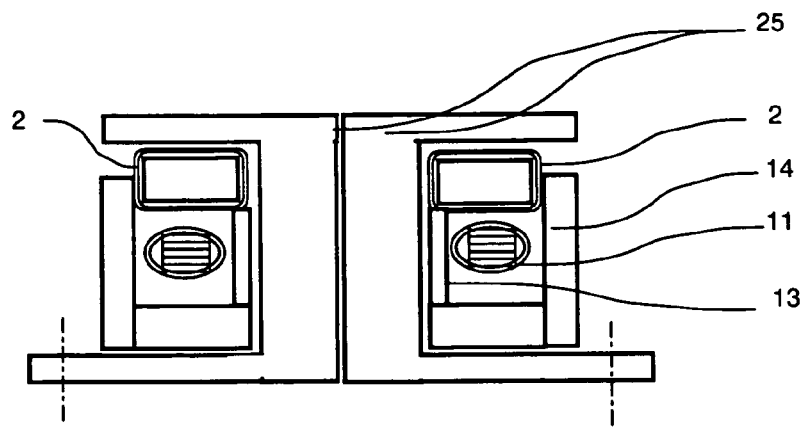

According to another alternative embodiment of the invention represented in FIG. 7, a second secondary electric winding 2 can completely surround one of the lateral shieldings 12A, 12B.

Figure 8:
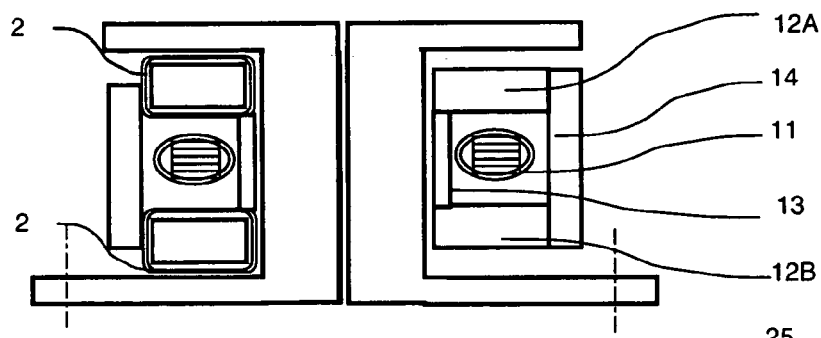
Figure 9:
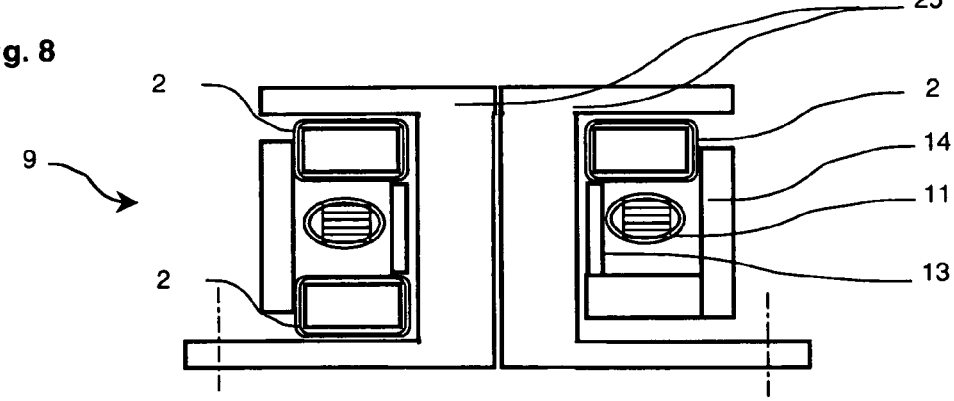
Figure 10:
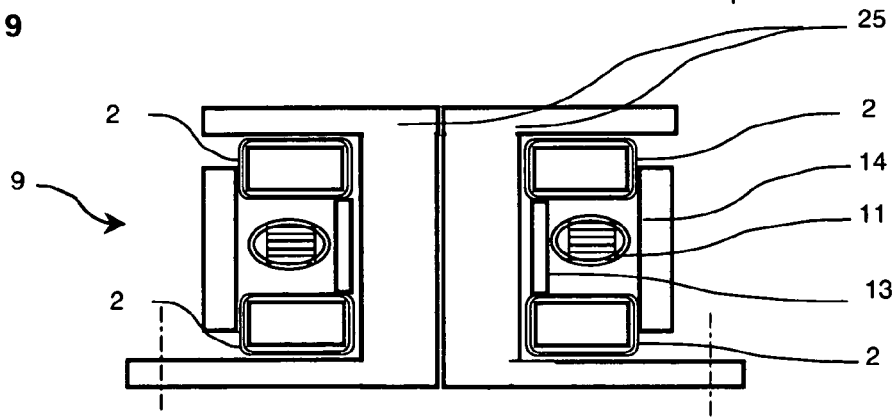

According to another alternative embodiment of the invention represented in FIGS. 8 to 10, a second secondary electric winding 2a can surround at least a part of a first shielding lateral 12A, and a second secondary electric winding 2b can surround at least a part of the second lateral shielding 12B. Said shieldings surrounded by the second secondary electric windings 2a, 2b form the magnetic circuits of at least two second current sensors.

According to another alternative embodiment, the magnetic core 16 can have a circular, oval or elliptical outline.

The device for measuring differential current 9 according to the different embodiment of the invention is particularly designed to be combined with a trip module 40 designed to send orders to a switchgear device 50. The trip module 40 is designed to be connected to a switchgear device 50 designed to connect at least N current lines 25. The device for measuring differential current 9 according to the embodiments of the invention is positioned around the N current lines 25.

Moreover, the trip module 40 preferably comprises at least one mixed current sensor 26 placed on at least one current line 25. Said sensors 26 are mixed magnetic sensors comprising a first winding 35 wound on a magnetic circuit 33 and designed to be connected to the power supply means 28 of a switchgear device 50. The mixed current sensors 26 comprise a second winding 34 designed to be connected to the processing means 29 of a switchgear device 50. The second windings 34 are wound on a support made of non-magnetic material placed around a current line 25 in which the current to be measured flows. The second winding 34 forms a secondary winding of a current transformer where said current line 25 forms a primary winding. The secondary winding supplies a measurement signal that is directly proportional to the intensity of the electric current flowing in the current line 25. The fact that there is no magnetic core liable to be saturated enables a wide measurement range to be achieved. The assembly 34, 25 forms a Rogowski type sensor designed for protection in the event of a single-phase short-circuit occurring on the current line provided with said sensor. All the characteristics of the mixed current sensors 26 are described in the French Patent application filed by the applicant recorded under the number 0405199. The description of said application is on these points incorporated here by reference.

In the embodiment, N−1 current lines 25 respectively have a mixed current sensor 26.

Moreover, the trip module 40 according to the invention can be integrated in an electrical switchgear device 50 such as a circuit breaker.

The circuit breaker 50 is fitted on electric current lines 25. The first windings 35 of the mixed current sensors 26 of the trip module 40 are then connected to the power supply means 28 of the switchgear device 50. The second windings 34 are connected to the processing means 29. The processing means 29 are themselves supplied by the power supply means 28.

Figure 11:
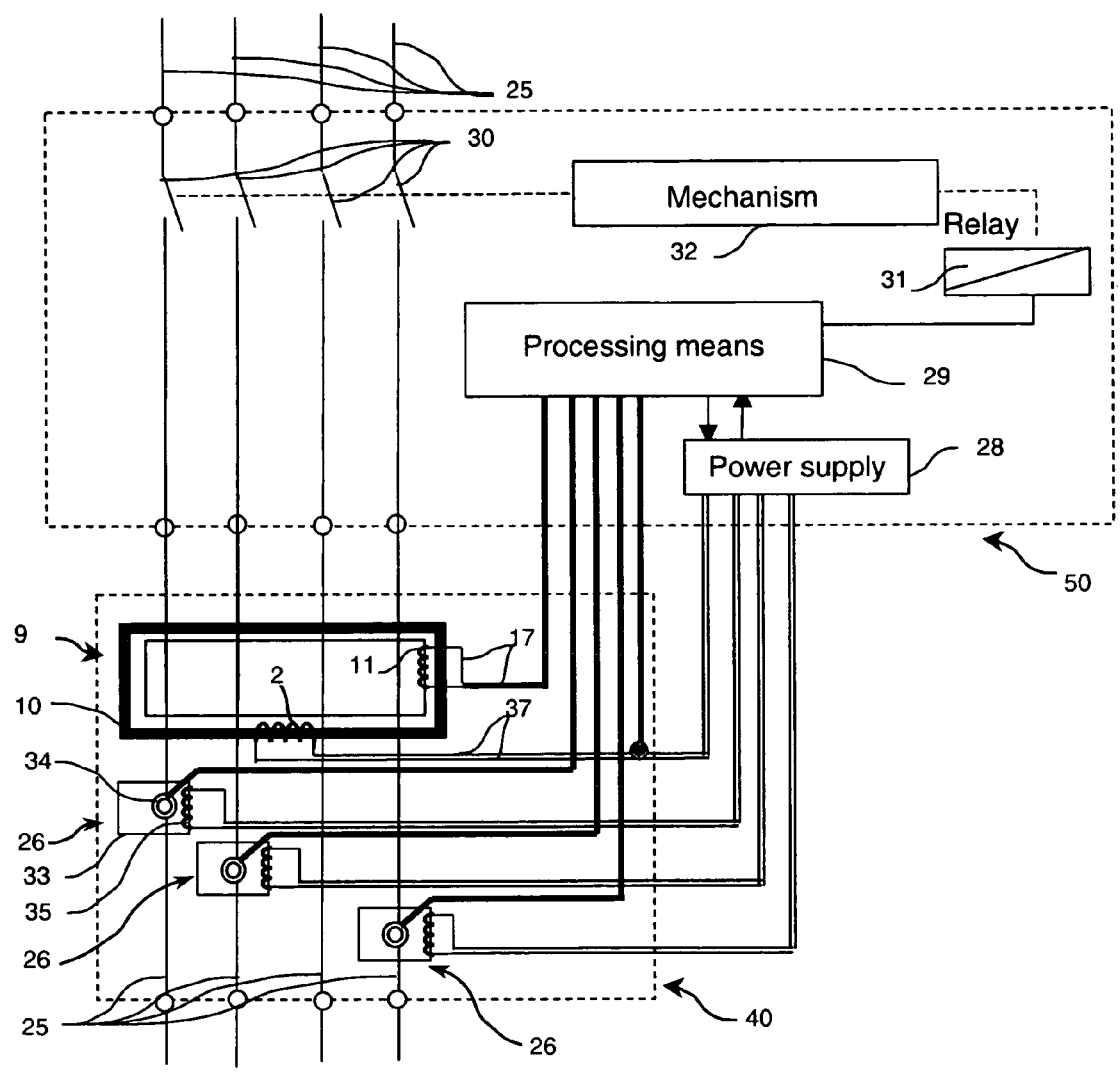
FIG. 11 represents a block diagram of a switchgear device comprising a trip module according to one embodiment of the invention.

As is represented in FIG. 11, N−1 current lines 25 respectively comprise a mixed current sensor 26.

Operation of the switchgear device 50 is as follows. If a differential current is detected by the differential sensor 9, the processing means 29 having received this information send the opening mechanism 32 an order to open the contacts 30 via the relay 31. The processing means 29 are supplied by the power supply means 28 via the windings 35 of the N−1 mixed current sensors 22.

If a short-circuit fault is detected on one of the current lines 25 comprising a mixed current sensor 26, the processing means 29 send the opening mechanism 32 an order to open the contacts 30 via the relay 31.

If a short-circuit fault occurs on the current line 25 that does not comprise a mixed current sensor 26, the short-circuit information is nevertheless received and analyzed by the processing means 29 via the second sensor of the differential sensor 9. The processing means 29 then send the opening mechanism 32 an order to open the contacts 30 via the relay 31.

In this way, in this new architecture, due to the presence of the second sensor of the differential sensor 9, protection of the installation is nevertheless ensured if a single-phase short-circuit occurs on the current line that does not comprise a mixed current sensor 26. Furthermore, the order to open the contacts 30 is sent even though the differential sensor 9 is saturated due to the presence of short-circuit current.

According to an alternative embodiment, the processing means 29 enable the missing value of the current I2 flowing in the last current line not provided with a current sensor 26 to be reconstituted from the measurement signals Isn, Is1, Is3 of the two or three mixed current sensors 26.

The signals Isn, Is1, Is3 are representative of the primary electric currents Ipn, Ip1, Ip3 flowing in the current lines 25 to be protected. According to this particular embodiment of the invention, the signal Isn is representative of a neutral primary current Ipn. In addition, the signals Is1 and Is3 are representative of the primary currents Ip1, Ip3 of two phases.

Figure 12:
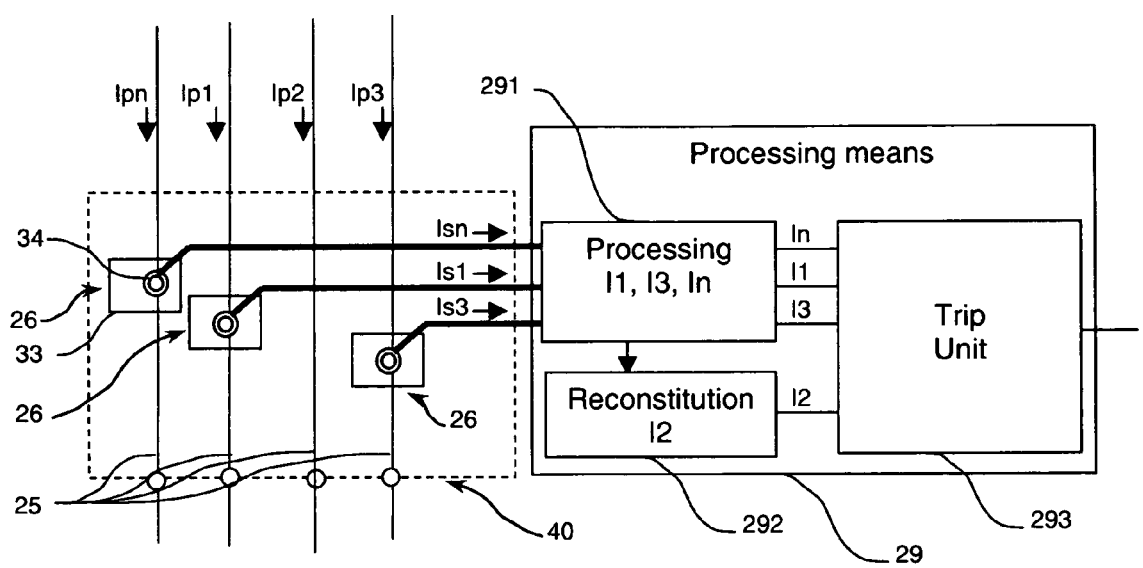
FIG. 12 represents a block diagram of a particular embodiment of the processing means of the switchgear device according to FIG. 11.

As represented in FIG. 12, the signals Isn, Is1, Is3 representative of the primary electric currents Ipn, Ip1, Ip3 are applied to the input of the processing circuit 291 of the processing means 29. The processing circuit 291 supplies signals In, I1, I3 representative of the measured and processed currents to a trip unit 293.

A reconstitution circuit 292 connected to the processing circuit 291 and to the trip unit 293 receives signals representative of the currents measured and processed by the processing circuit 291. When no differential fault is observed, the vector sum of the electric currents flowing in all the current lines is zero. The reconstitution circuit 292 can then compute and supply a signal I2 representative of the reconstituted phase.

The trip unit 293 thus receives signals representative of the currents of the three phases flowing in the current lines to be protected.

The trip unit 293 performs the tripping functions and supplies a tripping signal to the relay 31 when current signals In, I1, I2, I3 which it receives exceed thresholds during predetermined times. The tripping functions are in particular the long delay, short delay and immediate tripping functions. The relay 31 then commands opening of contacts 30 via the opening mechanism 32.

The invention claimed is:

1. A differential current sensor for measuring a differential current between at least two current lines, comprising:
   a first magnetic core surrounding the current lines, thereby forming a primary circuit of a transformer,
   a first secondary winding wound around said first magnetic core, thereby forming a secondary circuit of the transformer, said first magnetic core and first secondary winding forming a differential current sensor, and
   a metal shielding circumscribing the first secondary winding and the first magnetic core, at least one second secondary winding circumscribing at least a part of the metal shielding, said second secondary winding and said metal shielding forming at least one second current sensor for supplying an electric signal representative of a current flowing in at least one current line to a processing means.

2. The differential current sensor according to claim 1, wherein the metal shielding comprises an outer shielding for covering an outer surface of the magnetic core, an inner shielding for covering an inner surface of the magnetic core, and at least one lateral shielding for covering a lateral surface of the magnetic core.

3. The differential current sensor according to claim 2, wherein the metal shielding comprises two lateral shieldings.

4. The differential current sensor according to claim 3, wherein said second secondary winding surrounds at least a part of the outer shielding, at least a part of the inner shielding and at least a part of each of the lateral shieldings, and the shieldings surround the current lines.

5. The differential current sensor according to claim 4, wherein said second secondary winding completely surrounds the metal shielding.

6. The differential current sensor according to claim 3, wherein the second secondary winding surrounds at least a part of one of the lateral shieldings.

7. The differential current sensor according to claim 6, wherein the second secondary winding completely surrounds one of the two lateral shieldings.

8. The differential current sensor according to claim 6, wherein at least one second secondary winding surrounds at least a part of a first lateral shielding, and at least one second secondary winding surrounds at least a part of a second lateral shielding, said surrounded shieldings forming the magnetic circuits of at least two second current sensors.

9. The differential current sensor according to claim 2, wherein at least one of the shieldings surrounded by a second secondary winding comprises at least one air-gap.

10. A trip module connected to a switchgear device, said trip module comprising:
   N current lines, and
   a differential current sensor for measuring a differential current between said N current lines, said differential current sensor comprising:
      a first magnetic core surrounding the N current lines, thereby forming a primary circuit of a transformer,
      a first secondary winding wound around said first magnetic core, thereby forming a secondary circuit of the transformer, said first magnetic core and first secondary winding forming a differential current sensor, and
      a metal shielding circumscribing the first secondary winding and the first magnetic core,
      at least one second secondary winding circumscribing at least a part of the metal shielding, said second secondary winding and said metal shielding forming at least one second current sensor for supplying an electric signal representative of a current flowing in at least one current line to a processing means,
   wherein the second current sensor of the differential current sensor is connected to at least one of power supply means or processing means of said switchgear device, and
   the first secondary winding of the differential current sensor is connected to processing means of said switchgear device.

11. The trip module according to claim 10, wherein at least N−1 current lines have a mixed current sensor comprising:
   a first winding wound on a magnetic circuit and connected to the power supply means of a switchgear device, and
   a second winding wound on a non-magnetic circuit connected to the processing means of a switchgear device.

12. A system for measuring differential current comprising a trip module according to claim 10 and a switchgear device, wherein the switchgear device comprises power supply means, processing means, and an opening mechanism for opening electric contacts.

13. The system for measuring differential current according to claim 12, wherein the power supply means are connected to the mixed current sensors of the trip module via the first windings and are connected to at least one second secondary winding of the differential current sensor.

14. The system for measuring differential current according to claim 12, wherein the processing means are connected to mixed current sensors of the trip module via the secondary windings and are connected to the first secondary winding of the differential current sensor.

* * * * *